(12) United States Patent
Kautzsch et al.

(10) Patent No.: US 8,994,127 B2
(45) Date of Patent: Mar. 31, 2015

(54) METHOD OF FABRICATING ISOLATING SEMICONDUCTOR STRUCTURES USING A LAYOUT OF TRENCHES AND OPENINGS

(75) Inventors: Thoralf Kautzsch, Dresden (DE); Boris Binder, Dresden (DE); Torsten Helm, Bannewitz (DE); Stefan Kolb, Unterschleissheim (DE); Marc Probst, Radeberg (DE); Uwe Rudolph, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 457 days.

(21) Appl. No.: 13/304,334

(22) Filed: Nov. 24, 2011

(65) Prior Publication Data

US 2013/0134530 A1    May 30, 2013

(51) Int. Cl.
*H01L 29/84* (2006.01)
*B81C 1/00* (2006.01)

(52) U.S. Cl.
CPC ..... *B81C 1/00158* (2013.01); *B81B 2201/0264* (2013.01); *B81B 2203/0127* (2013.01)

USPC ...................................... 257/417; 257/E21.24

(58) Field of Classification Search
CPC ......... H01L 29/84; H01L 29/68; H01L 29/86; B81B 1/00; B81B 5/00; B81B 7/02; B81B 7/04; G01L 9/06
USPC ............ 257/417, 467, 622, E21.002, E21.24, 257/E29.324, E29.347
See application file for complete search history.

(56) References Cited

U.S. PATENT DOCUMENTS

| | | | |
|---|---|---|---|
| 6,893,928 B2 | 5/2005 | Sato et al. | |
| 7,145,215 B2 | 12/2006 | Inoh et al. | |
| 7,235,456 B2 | 6/2007 | Sato et al. | |
| 2006/0131651 A1* | 6/2006 | Sato et al. | ..................... 257/347 |
| 2008/0233698 A1 | 9/2008 | Sato et al. | |

FOREIGN PATENT DOCUMENTS

DE          10100438 B4       5/2006

\* cited by examiner

*Primary Examiner* — Selim Ahmed
(74) *Attorney, Agent, or Firm* — SpryIP, LLC

(57) ABSTRACT

Embodiments related to semiconductor manufacturing and semiconductor devices with semiconductor structure are described and depicted.

7 Claims, 10 Drawing Sheets

B

METHOD OF FABRICATING ISOLATING SEMICONDUCTOR STRUCTURES USING A LAYOUT OF TRENCHES AND OPENINGS

BACKGROUND

Semiconductor devices are used today in ever-increasing numbers in the daily life. Typically, such semiconductor devices are manufactured by many steps in the manufacturing process including structuring masks, depositing semiconductor or non-semiconductor layers, etching these layers, etc.

For example in the field of integrated pressure sensor devices, a sequence of process steps is typically applied which includes the deposition and structuring of an oxide layer on top of a silicon substrate. On top of the structured oxide layer, a poly-Si (polychrystalline silicon) is deposited. After structuring the poly-Si layer, the oxide layer acting as sacrificial layer is etched by a wet chemical etching step.

Recently, a new process, the so-called Venezia process, has been described to form silicon membranes within a silicon substrate. For this, a trench etching into a silicon substrate and a high temperature step in pure hydrogen are combined to form a monocrystalline silicon plate overlying a closed cavity inside the silicon substrate. However, as the silicon plate is directly connected to the silicon substrate, this technique cannot be easily used in pressure sensor applications due to parasitic effects resulting from the direct connection.

SUMMARY

In one aspects, a method of fabricating a semiconductor structure comprises the formation of a plurality of first trenches and of at least a second trench in the semiconductor substrate. A migration process is applied such that the first trenches are changed to a continuous semiconductor layer extending substantially in parallel to a main surface of the semiconductor substrate and being separated from the underlying part of the substrate in a direction perpendicular to the main surface by a continuous cavity, wherein the continuous cavity is connected to at least a first opening in the substrate surface formed by the at least second trench. A first dielectric layer is formed to fill at least an upper portion of the at least first opening while leaving the cavity substantially unfilled. Then portions of the continuous semiconductor layer are removed to form at least a second opening connecting the substrate surface to the cavity. Then at least upper portions of the at least second opening are filled with a second dielectric layer such that the cavity is sealed.

In a further aspect, a method of fabricating a semiconductor structure comprises the formation of a plurality of first trenches in a semiconductor substrate. A migration process is then applied such that the first trenches are changed to a continuous semiconductor layer extending substantially in parallel to a main surface of the semiconductor substrate and being separated from the underlying part of the substrate in a direction perpendicular to the main surface by a continuous cavity. At least a first opening is formed in the substrate surface which connects the substrate surface to the continuous cavity in the semiconductor substrate. A first dielectric layer is formed to fill at least an upper portion of the at least first opening while leaving the cavity essentially unfilled. Portions of the semiconductor material are removed to form at least a second opening connecting the substrate surface to the cavity. At least an upper portion of the at least second opening is filled with a second dielectric layer such that the cavity is sealed.

In a further aspect, a device comprises a semiconductor substrate of bulk material, a semiconductor plate comprising bulk material extending substantially along a plane which is parallel to a main surface of the substrate and located inside the substrate. The semiconductor plate has sidewalls essentially surrounding said semiconductor plate, The devices further comprises a continuous cavity located between the semiconductor substrate and the semiconductor plate in a direction perpendicular to said plane, and a connection region to connect said semiconductor plate and said semiconductor substrate, wherein said connection region surrounds said semiconductor plate. Said connection region further comprises first connection regions comprising a first deposited dielectric material and second connection regions comprising a second deposited dielectric material and both first and second connection regions abut at said sidewalls of said semiconductor plate.

BRIEF DESCRIPTION OF THE SEVERAL VIEWS OF THE DRAWINGS

FIGS. 1a-6a and 1b-6b show schematic top-down and crossectional views of the different process steps according to an embodiment;

DETAILED DESCRIPTION

The following detailed description explains exemplary embodiments of the present invention. The description is not to be taken in a limiting sense, but is made only for the purpose of illustrating the general principles of embodiments of the invention while the scope of protection is only determined by the appended claims.

Further, it is to be understood that the features of the various exemplary embodiments described herein may be combined with each other, unless specifically noted otherwise.

In the various figures, identical or similar entities, devices, structures, layers, etc. may have assigned the same reference number.

In the described embodiments, specific views or schematic views of devices, elements etc. such as cross-sectional view, top views, bottom views, three-dimensional view etc. are shown in one or more of the figures in order to allow a better understanding of these embodiments. It is however to be noted that these views may not be drawn to scale. Furthermore, these views may not be drawn in a proportional manner to allow a better understanding of these embodiments. It is therefore to be understood that dimensions of certain elements, parts or portions of elements etc. may be provided in the figures larger or smaller in relation to other elements or parts of elements.

The embodiments described below are directed to a new concept to produce a Si membrane for applications in a pressure sensors or a bolometer. However, it is to be noted that the application of the described embodiments are not restricted to such environments.

Referring now to FIGS. 1 to 6, an embodiment of a manufacturing process of a micro-mechanical device according to an embodiment is shown.

Figure 1A:
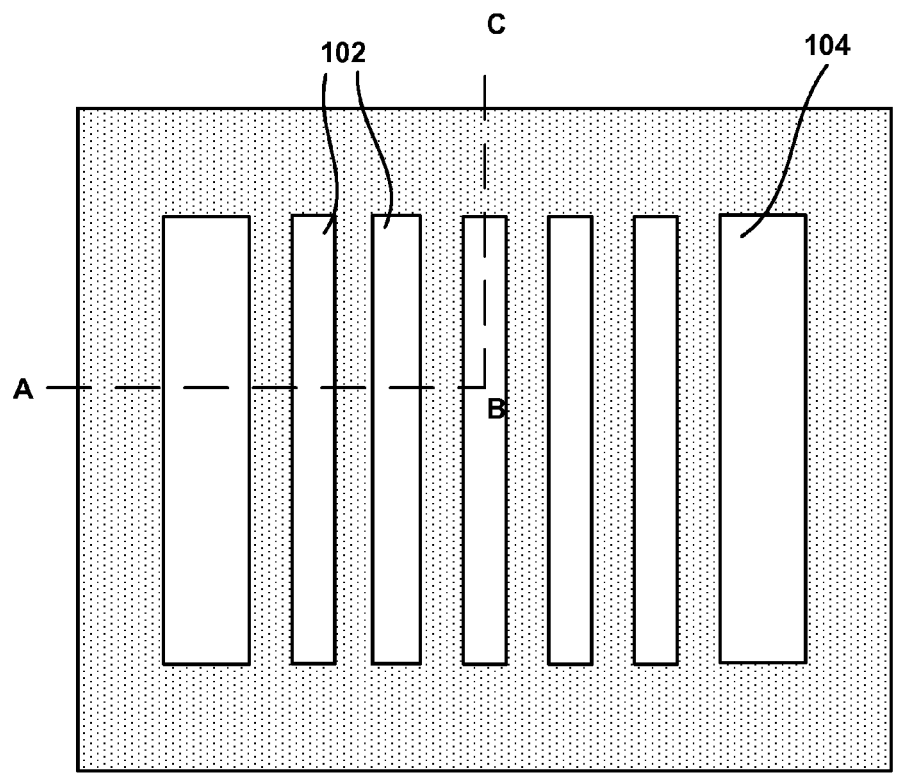
Figure 1B:
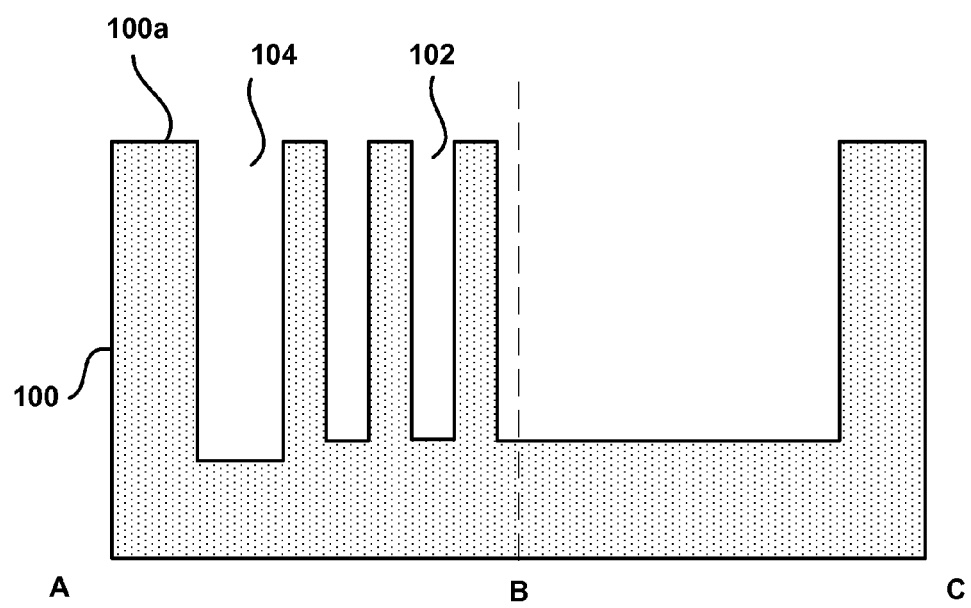

FIG. 1a shows a top-down view of a substrate 100 into which a structured element is formed as described below. FIG. 1b shows a cross-sectional view of the top-down view from FIG. 1a if cut along the line A-B-C. The substrate 100 has a first main surface 100a. The substrate comprises bulk semiconductor material such as bulk Si, bulk Ge, etc. The substrate 100 may be a mono-crystalline wafer or part of a monocrystalline wafer formed by breaking or slicing a wafer into smaller pieces. In some embodiments, the semiconductor substrate 100 may have one or more layers overlaying the bulk material. In FIG. 1a and the following figures, a spatial direction which is perpendicular to the main surface 100a may be also referred in the following as vertical direction. A direction in parallel to the main surface may be referred to as horizontal direction. It is to be understood that the concept of vertical and horizontal is used herein to refer to orientations with respect to the main surface 100a of the substrate.

Referring now to FIGS. 1a and 1b, a plurality of first trenches 102 are formed in the substrate by removing the mono-crystalline bulk material of the semiconductor substrate 100. Additionally, at least a second trench 104 is formed in the semiconductor substrate 100 close to the plurality of trenches 102. The trenches 102 and 104 may for example be formed by depositing and structuring a hard mask and etching selectively to the hardmask to remove the bulk material of the substrate. The trenches 102 and 104 may be separated from each other or may be connected at other locations to each other, i.e. may be part of a same overall trench structure. The trenches 102 and the at least one trench 104 may be formed during the same processing step or formed by two separate removal steps. The trenches 102 and 104 may have a circular shape or a stripe-like shape if cut in a plane parallel to the main surface 100a.

The trenches 102 may for example include trenches such as deep trenches or other trench shapes extending in the vertical direction within the substrate. In embodiments, the trenches may be elongate in the vertical direction such that the widths in a horizontal direction are smaller than the depth in the vertical direction. In some embodiments, the trenches may have in the vertical direction a depth in the range between 50 nm and 100 micrometers. In some embodiments the width in a horizontal direction of the trench 102 may each be within the range of 10 nm to 10 micrometers, and in one embodiment in the range of 100 nm to 2 micrometers. The aspect ratio of each of the trenches 102 may be chosen in some embodiment to be in the range between 5 and 100.

The trench 104 may have the same vertical extension as the trenches 102 or have a larger depth. The depth of trench 104 may be preferentially between 100% and 120% of the depth of a trench 102.

The at least one trench 104 has a minimal width in a horizontal direction which is larger than a minimal width of a trench 102 in the horizontal direction. The minimal width of trench 104 may be chosen to be at least 50% larger than the minimal width of the trenches 102.

The minimal widths of the trenches 102 may be chosen to be equal. The trenches 102 may be arranged in an array-like pattern. The distance between individual trenches 102 may be chosen to be essentially equal for all trenches or may be varied within the array. The distance may be chosen as to not exceed ten times the minimal width of the trench 102. In one embodiment the distance between the trenches does not exceed twice the minimal width of the trench 102.

Figure 2A:
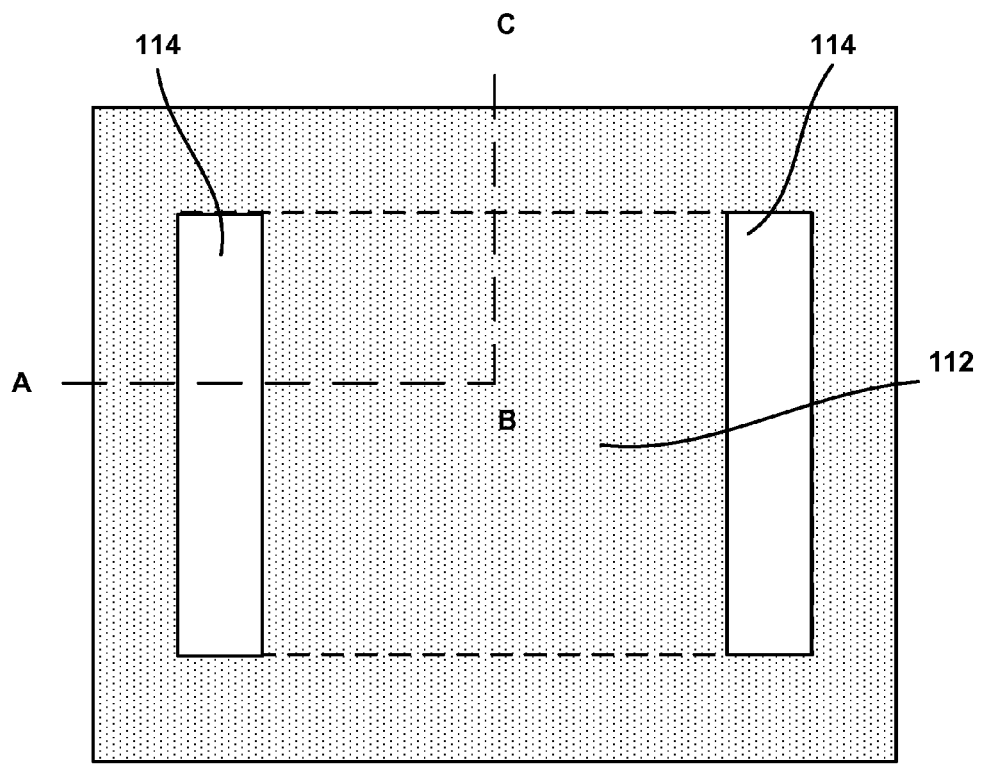
Figure 2B:
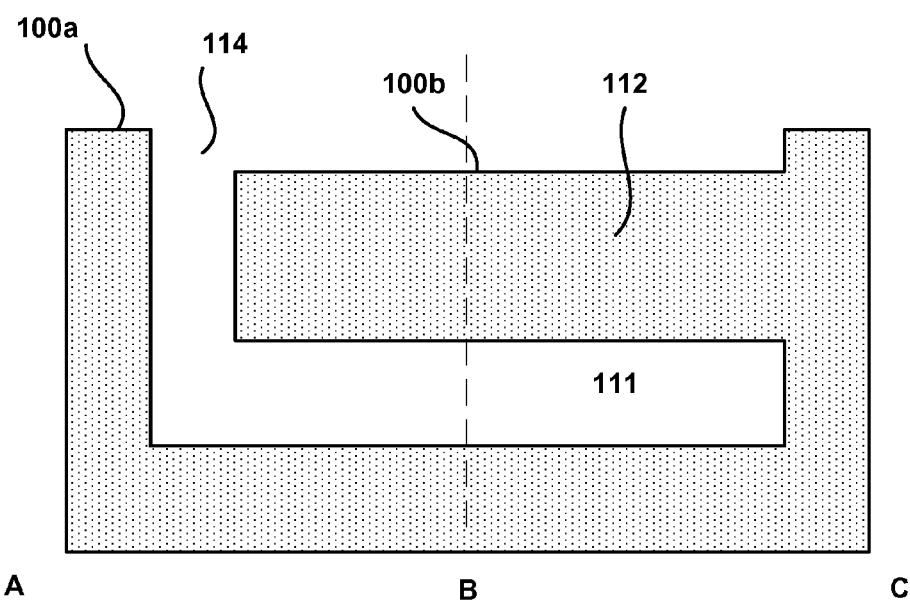

Referring now to FIGS. 2a and 2b, a migration process is applied to the structure as described in FIGS. 1a and 1b such that the trenches 102 are changed to a continuous semiconductor layer 110 which extends substantially in parallel to the main surface 100a. The continuous semiconductor layer 112 is separated from the underlying part of the substrate 100 in the vertical direction by a continuous cavity 111. The continuous cavity 111 is connected to a first opening 114 which is formed in the substrate by the at least one trench 104.

The migration process includes in embodiments a heat treatment in a hydrogen atmosphere which is applied for some time. During the migration process, the material located in a horizontal direction between the trenches 102 migrates to form the continuous semiconductor layer 112 and the continuous cavity 111. The migration process may be a process in which the removed material is recrystallized after migration by a self-organizing process such as a migration process known as the Venezia process. By heating the substrate to temperatures between 1000 and 1200° C. and providing a hydrogen atmosphere with a partial pressure in the range between 10 and 10000 Pa, a H-bake process is provided in which the bulk semiconductor material can be converted in a gas phase. For example, in the case of silicon as bulk material, the Si atoms are converted by the heat treatment in hydrogen atmosphere to silane gas. The Si atoms are then recrystallized from the silane gas to form a continuous layer of crystalline material.

In one embodiment a step may be formed between the substrate surface 100a and the surface 100b of continuous semiconductor layer 112 due to the migration process.

Figure 3A:
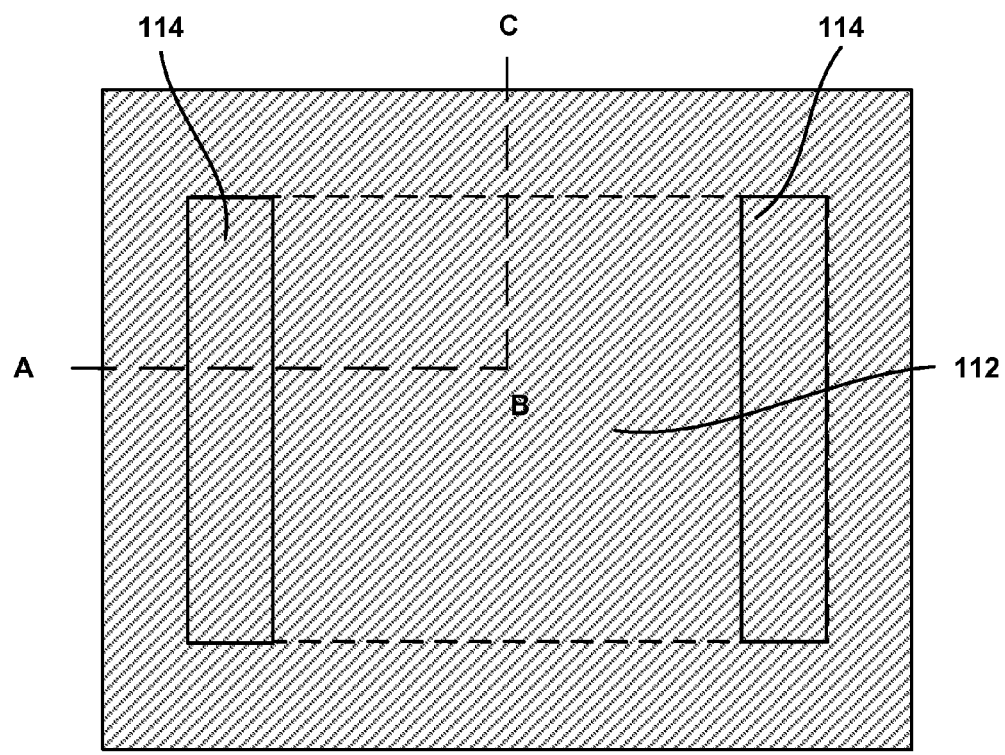
Figure 3B:
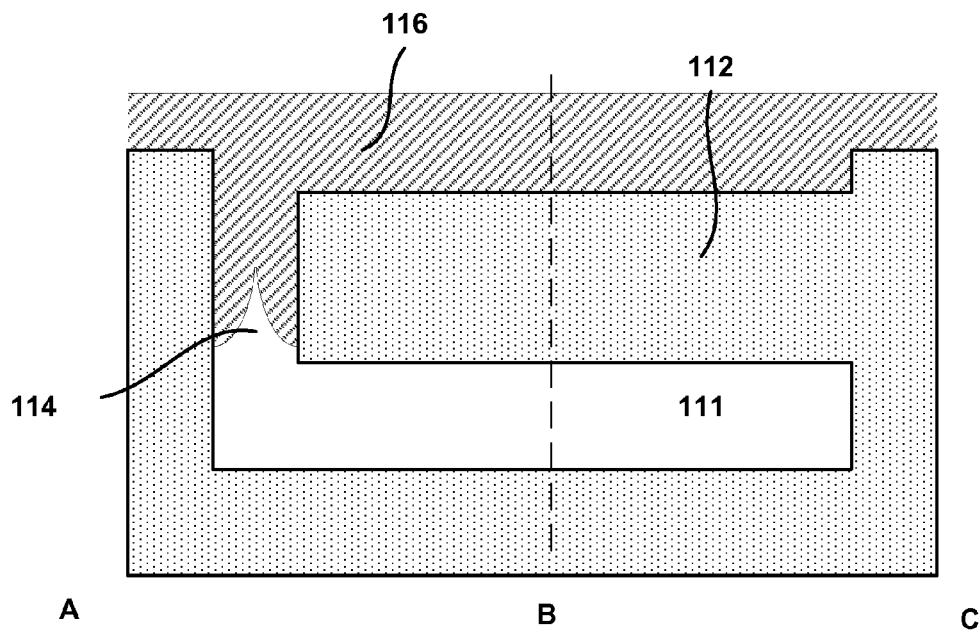

Referring now to FIGS. 3a and 3b, a dielectric capping layer 116 is formed on the substrate 100 and on the continuous semiconductor layer 112. The capping layer 116 fills at least an upper portion of the opening 114 while leaving the continuous cavity 111 substantially unfilled. The dielectric layer 116 may comprise silicon oxide or silicon nitride which are deposited by a nonconformal deposition process. Such process may include HDP (high density plasma) deposition of silicon oxide comprising a plasma enhanced treatment that is tunable for maximum deposition at side walls or a BPSG (boron phosphorous silicate glass) deposition with thermal reflow or a sputtering process. The capping layer 116 may be formed in some embodiments from a single process or may be composed of several subsequently formed sublayers comprising the same or different dielectric materials. Such a sublayer may comprise a non-conformally deposited layer and a conformally deposited liner or a spacer. The conformal liner may be formed from LPCVD nitride or an oxidation of silicon. In some embodiments the formation of the capping layer 116 may include planarization or etching steps being performed between the formation of the sublayers. A portion of the capping layer 116 may also be formed along the walls of the continuous cavity 111, as long as it only partially fills the cavity 111 below the continuous semiconductor layer 112. The portion of the capping layer may preferentially fill the cavity to not more than 50% of the cavity's volume, preferentially to less than 10%. In one embodiment, an unfilled portion of the cavity 111 should extend below the first opening 114.

In an embodiment, the capping layer 116 is formed such that the first opening 114 is filled at a level below the surface 100b of the continuous semiconductor layer 112. Such a process may include an HDP process comprising a plasma enhanced treatment that is tunable for maximum deposition. In an embodiment, such an HDP process comprises at least a two step deposition process, where first a layer of silicon oxide is formed on the structure configured to serve as an oxide reservoir, followed by at least a second HDP deposition step with non-zero bias power configured to achieve an increased redeposition rate inside the opening 114 at the sidewalls below the substrate surface. In an embodiment, the first step may be formed by the HDP deposition of an unbiased liner with an RF-bias of substantially 0 W. In another embodiment, the first step deposition may be performed by other oxide formation techniques like plasma-enhanced chemical vapor deposition (PE-CVD). In an embodiment, the bias power of the second step may be chosen between 1000 W and 5000 W for openings with sizes between 150 nm and 1000 nm. For other dimensions, the bias power has to be adjusted accordingly. In an embodiment, deposition steps with high bias power are alternated with steps of low bias power. In an embodiment, the bias power between individual steps is varied by a factor of 1.5 to 5. In an embodiment, the bias power is varied for the second deposition step from 2000 W to 4000 W, followed by a low-bias deposition at 1000 W. It is to be understood that these bias values are exemplary embodiments only of the underlying concept that the process comprises a deposition process with at least one step tailored towards high redeposition rate at the sidewalls of the opening below the substrate surface.

After forming the capping layer 116, the capping layer may be planarized by conventional planarization techniques like chemical mechanical polishing or etchback or a combination thereof. In an embodiment, the capping layer 116 is planarized down to the substrate surface 100a.

Figure 4A:
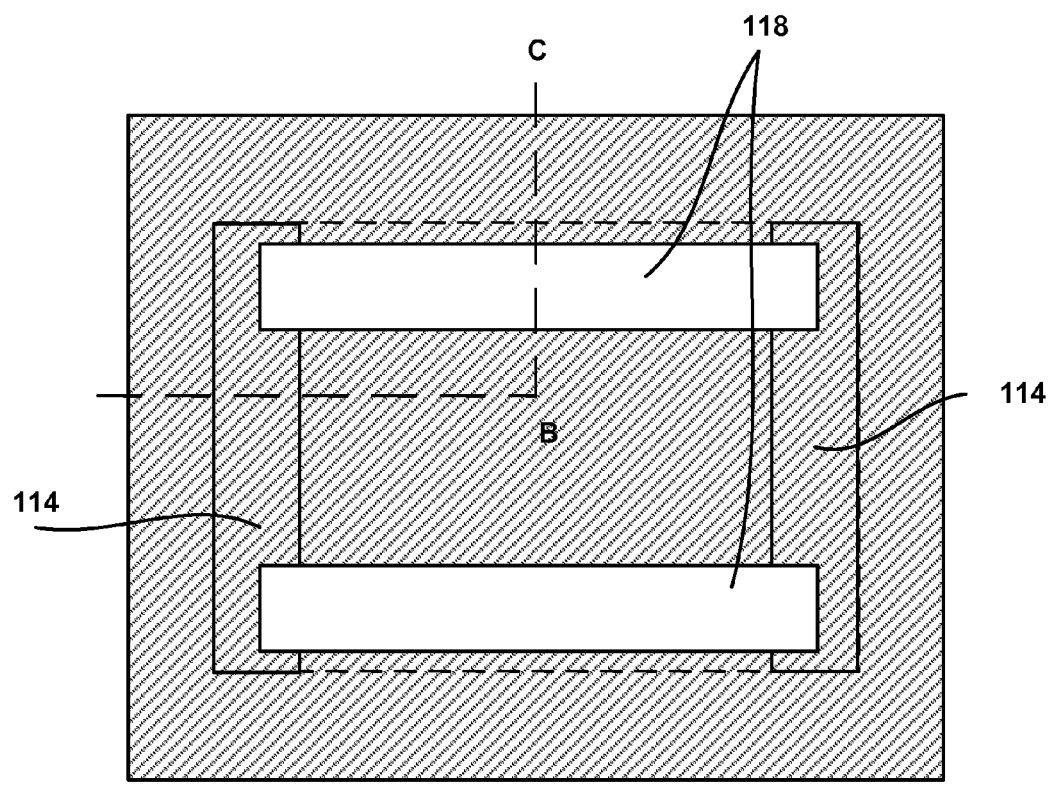
Figure 4B:
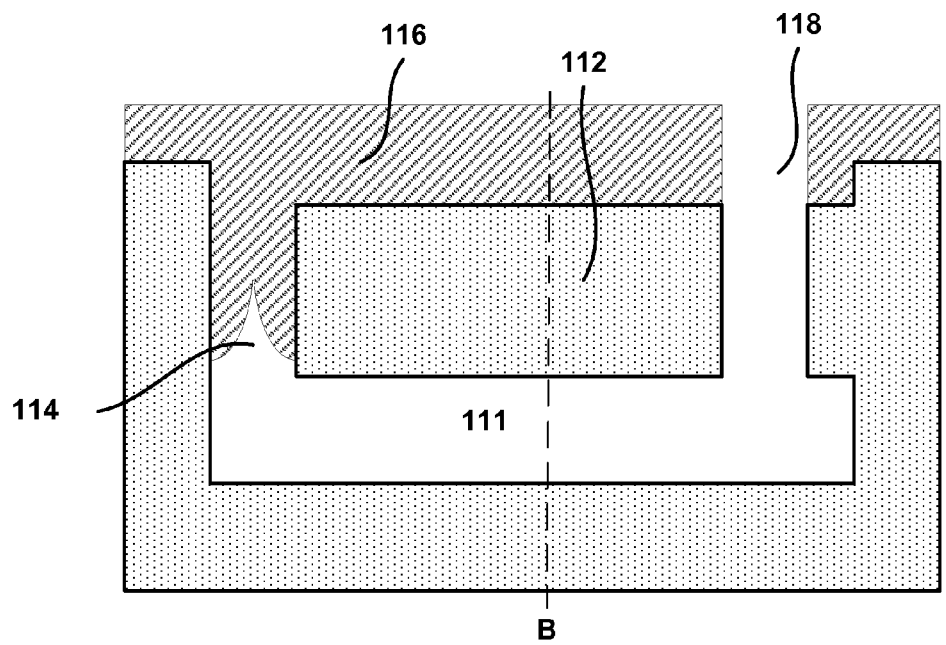

Referring now to FIGS. 4a and 4b, at least a second opening 118 is formed by removing portions of the continuous semiconductor layer 112 such that the cavity 111 is connected to the substrate surface. The second opening 118 may for example be formed by a photomask and subsequent etching of the underlying unmasked material until the cavity 111 is reached. The patterning may also involve depositing and structuring a hard mask prior to removing the semiconductor material. The photomask may then be removed prior to removing the semiconductor material. In an embodiment, at least part of the dielectric capping layer 116 is used as a hardmask to form the second openings 118.

Figure 5A:
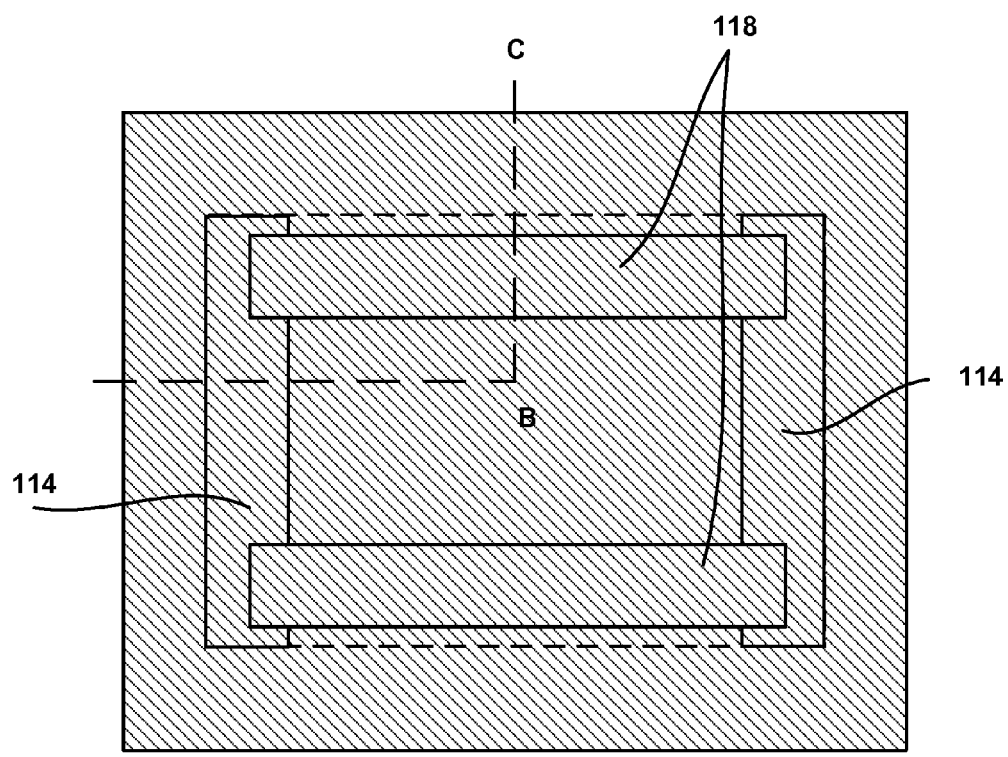
Figure 5B:
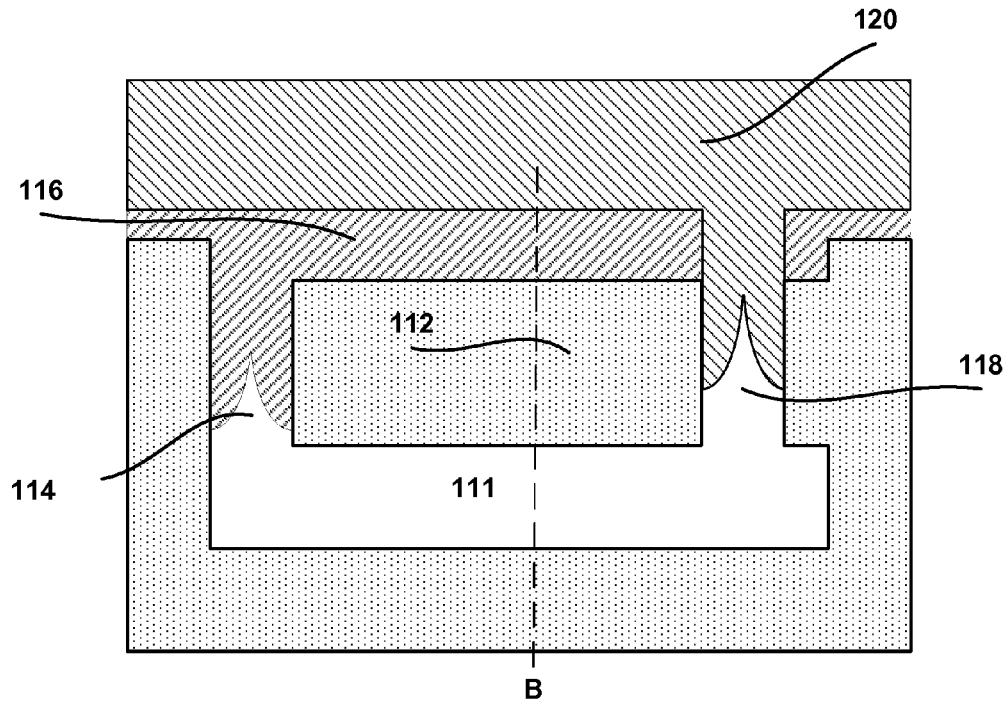

Referring now to FIGS. 5A and 5B, a second dielectric capping layer 120 is formed on the substrate 100 and the dielectric capping layer 116. The capping layer 120 fills at least an upper portion of the opening 118 while leaving the continuous cavity 111 essentially unfilled. The second capping layer 120 may be formed by a similar process as described for capping layer 116.

The second dielectric layer 120 may comprise silicon oxide or silicon nitride which are deposited by a nonconformal deposition process. Such process may include HDP (high density plasma) deposition of silicon oxide comprising a plasma enhanced treatment that is tunable for maximum deposition at side walls or a BPSG (boron phosphorous silicate glass) deposition with thermal reflow or a sputtering process. The capping layer 120 may be formed in some embodiments from a single process or may be composed of several subsequently formed sublayers comprising the same or different dielectric materials. Such a sublayer may comprise a non-conformally deposited layer and a conformally deposited liner or a spacer. The conformal liner may be formed from LPCVD nitride or an oxidation of silicon. In some embodiments the formation of the capping layer 120 may include planarization or etching steps being performed between the formation of the sublayers. A portion of the capping layer 120 may also be formed along the walls of the continuous cavity 111, as long as it only partially fills the cavity 111 below the continuous semiconductor layer 112. The portion of the capping layer may preferentially fill the cavity to not more than 50% of the cavity's volume, preferentially to less than 10%. Preferentially, an unfilled portion of the cavity 111 should extend below the second opening 118.

In an embodiment, the capping layer 120 is formed such that the second opening 118 is filled at a level below the surface 100b of the continuous semiconductor layer 112.

Figure 6A:
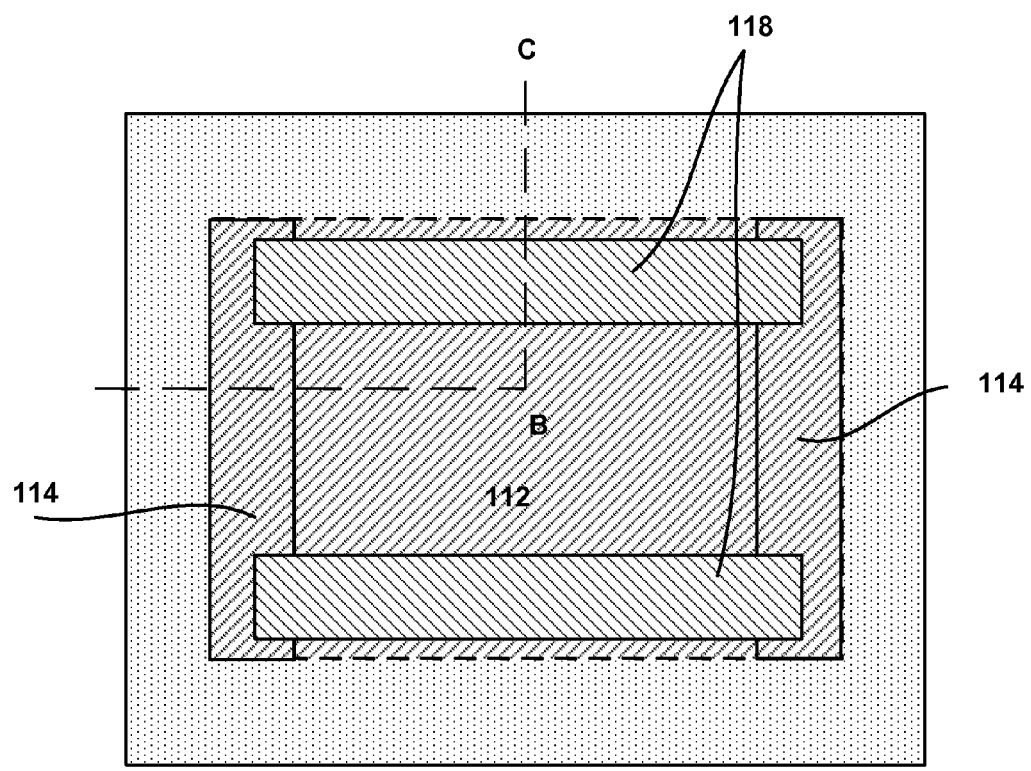
Figure 6B:
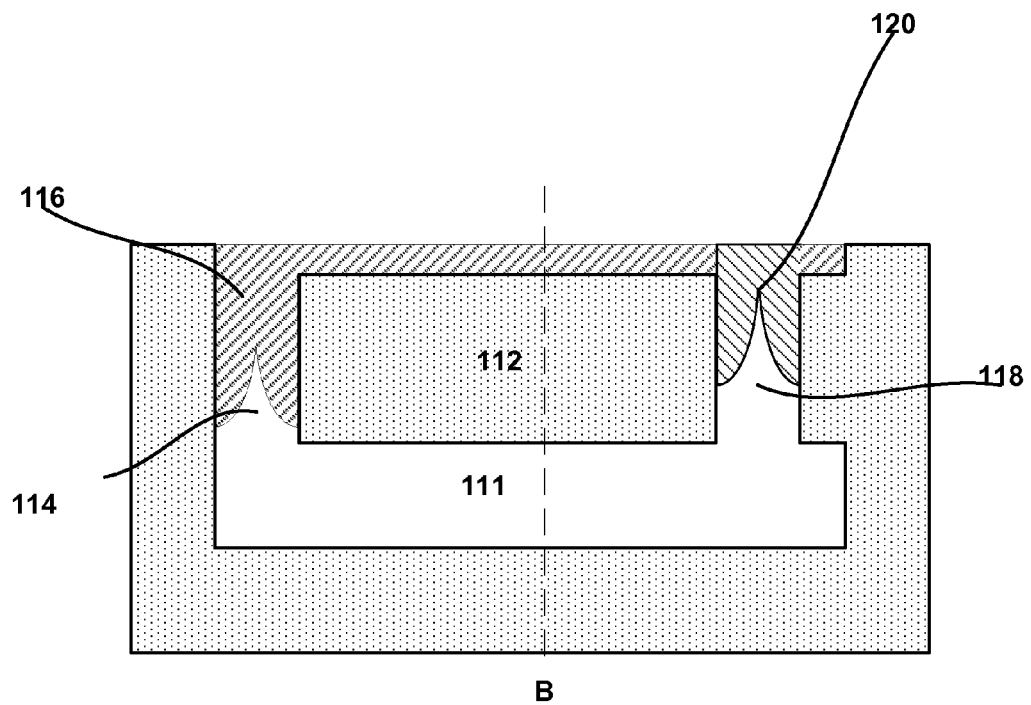

After forming the second capping layer 120, at least the second capping layer may be planarized by conventional planarization techniques like chemical mechanical polishing or etchback or a combination thereof. FIGS. 6a and 6b show an embodiment, where the capping layers 116 and 120 are planarized down to the substrate surface 100a, while leaving the first and second openings filled with the capping layers. In a further embodiment, the capping layers may also be removed from the surface 100b, while leaving the first and second openings filled with the capping layers.

Figure 7A:
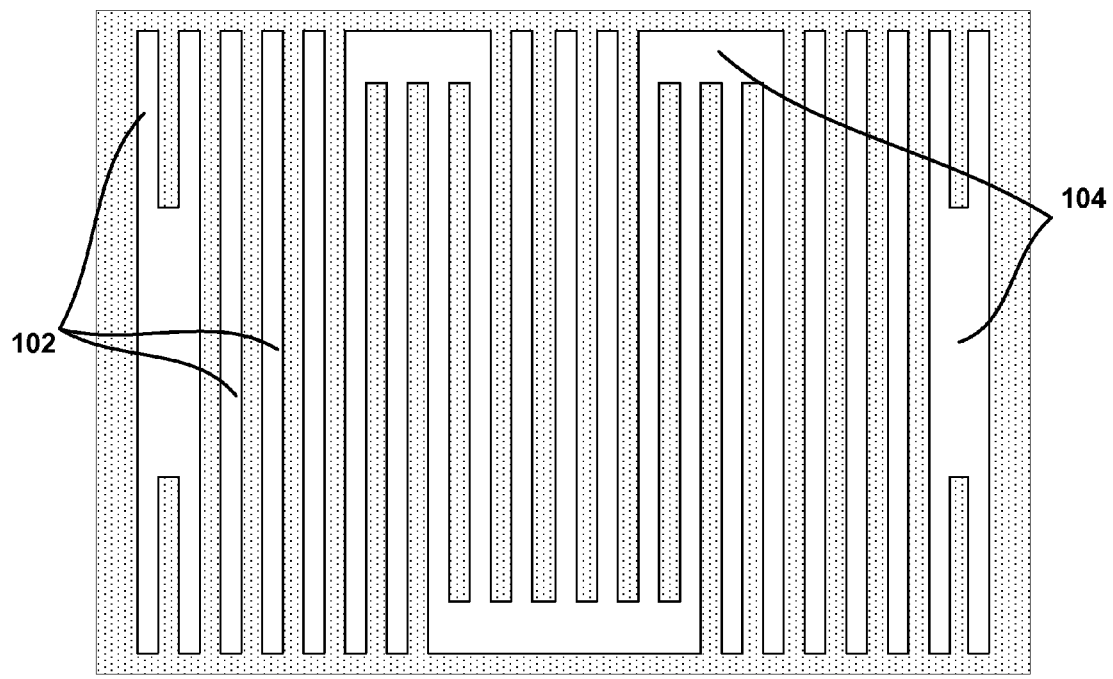
FIGS. 7a and 7b shows a schematic top-down and cross-sectional view according to another embodiment.
Figure 7B:
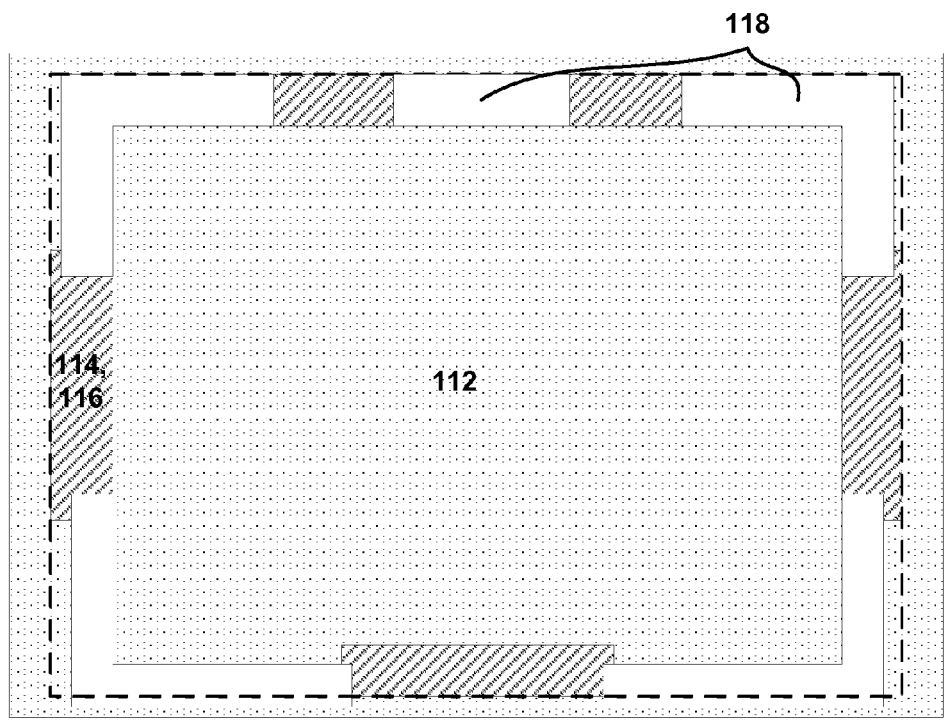

Referring now to FIGS. 7a and 7b, a further embodiment is shown for a layout of trenches and openings in order to create an isolated silicon plate. FIG. 7a shows an exemplary schematic layout/arrangement of first and second trenches in a top-down view of the substrate surface. First trenches are arranged in a strip-like pattern to form an array of trenches 102. Second trenches 104 are implemented in an edge region of the array, which extend over two or more neighboring trenches 102.

In some embodiments, trenches 104 may have an elongated shape if cut in a plane parallel to the main surface 100a, defining a minimal width and a length of a trench 104 and a crossectional area. In an embodiment, the minimal width of trench 104 in the horizontal direction may extend in the same direction as the minimal width of a neighboring trench 102. In other embodiments, the minimal width of the trench 104 may extend in a direction orthogonal to the extension of the minimal width of the a neighboring trench 102.

FIG. 7b shows the layout of FIG. 7a after performing the migration process and forming the first capping layer. After the migration process, a continuous semiconductor region 112 is formed, and first openings 114 are formed at the location of the second trenches 104, and filled with the capping layer 116. Then second openings 118 are formed such that the continuous semiconductor region becomes electrically disconnected from the silicon substrate 100. After filling the second openings 118 with the second dielectric capping layer 120, the remaining continuous semiconductor layer forms a silicon plate which is completely surrounded by a dielectric region.

In an embodiment, the sum of the cross-sectional areas of the first and second openings in a plane parallel to the main surface are of the same order of magnitude, in order to provide a good mechanical stability of the continuous semiconductor layer in respect to the substrate during processing. In an embodiment, the sum of the cross-sectional area of the second openings accounts to at least 20% and not more than 80% of the sum of the cross-sectional areas of the first openings. In another embodiment, the sum amounts to at least 60% and not more than 140%.

As the minimal width of the first and second openings define a minimum thickness requirement for the deposition of the capping layers (in order to fill the openings), it is desirable to have small minimum widths for this reason. On the other side, wider minimal widths relax lithographic and etching requirements and would also result in better thermal and electrical insulation of the resulting silicon plate structure.

Figure 8A:
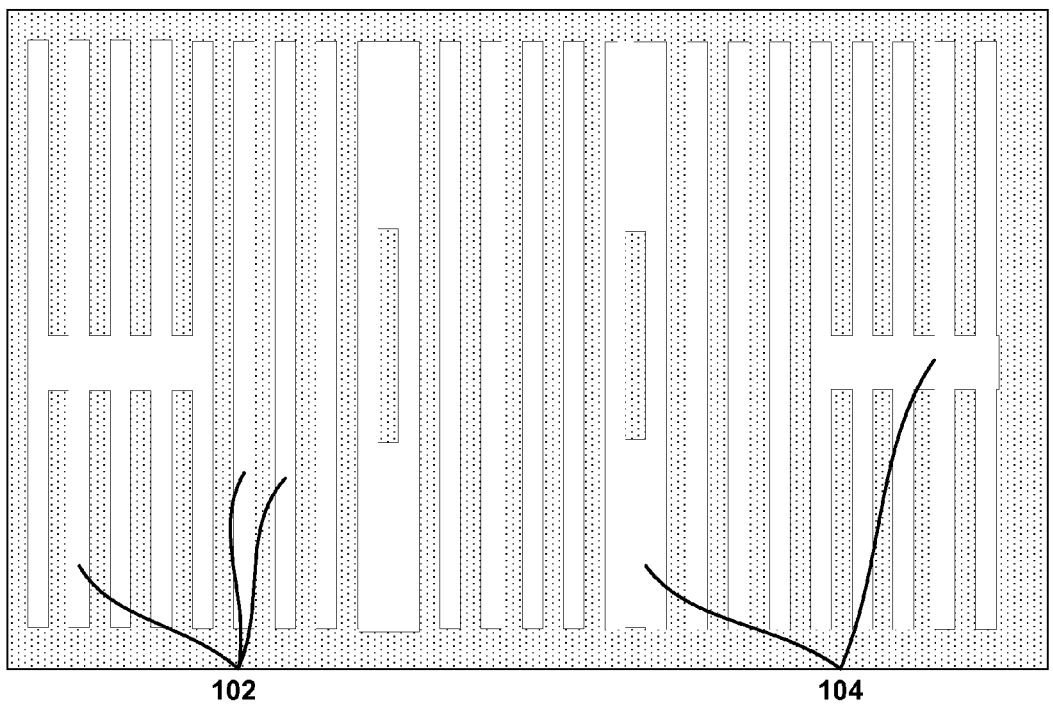
FIGS. 8a and 8b shows a schematic top-down and cross-sectional view according to another embodiment.
Figure 8B:
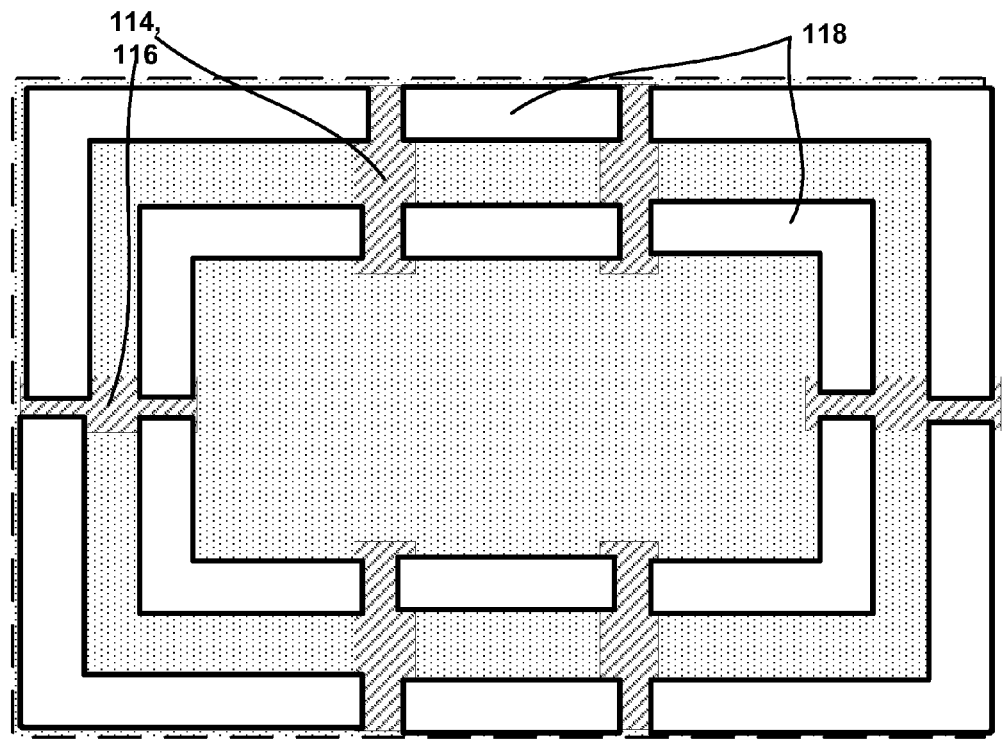

FIG. 8a and FIG. 8b show an example on how to achieve a isolation region which is effectively wider than the minimum width of the openings 114 and 118. In FIG. 8a, the trenches 104 are formed with the elongated direction extending from the edge towards the inside of the continuous semiconductor region 112. In FIG. 8b, multiple second openings 118 are formed to connect the long sides of the first openings and, after filling with the second capping layer, form multiple ring-like oxide regions, effectively increasing the thermal and electrical insulation of the inner silicon plate to the substrate, as compared with a single ring as shown in FIG. 7b.

Figure 9A:
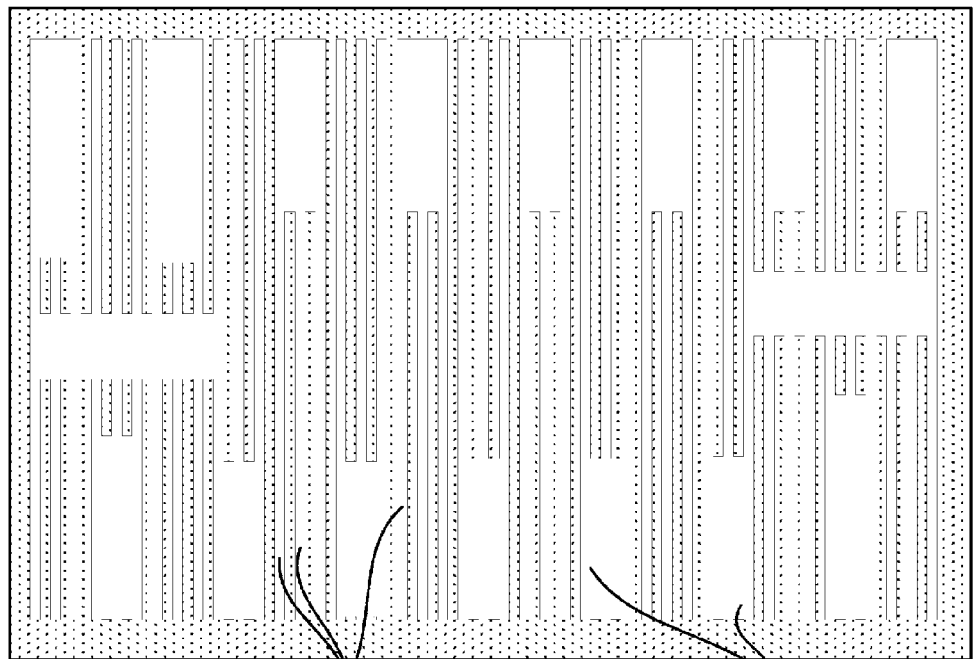
FIGS. 9a and 9b shows a schematic top-down and cross-sectional view according to another embodiment.
Figure 9B:
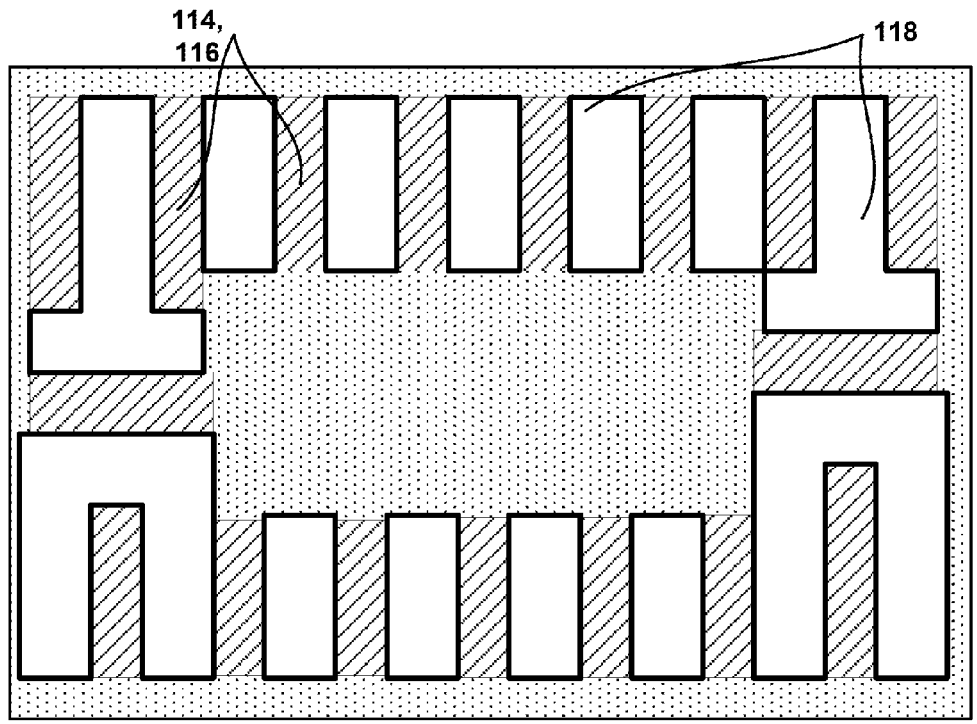

In another embodiment shown in FIG. 9a, the trenches 104 are formed with the elongated direction extending from the edge towards the inside of the continuos semiconductor region, but with a denser spacing between them. As shown in FIG. 9b, the second openings 118 are then also formed extending in the same direction. After filling with the second capping layer, an oxide ring is formed, which forms an insulation between the substrate and the continuous semiconductor layer which is larger than the minimal width of the first and second openings 114 and 118.

Figure 10A:
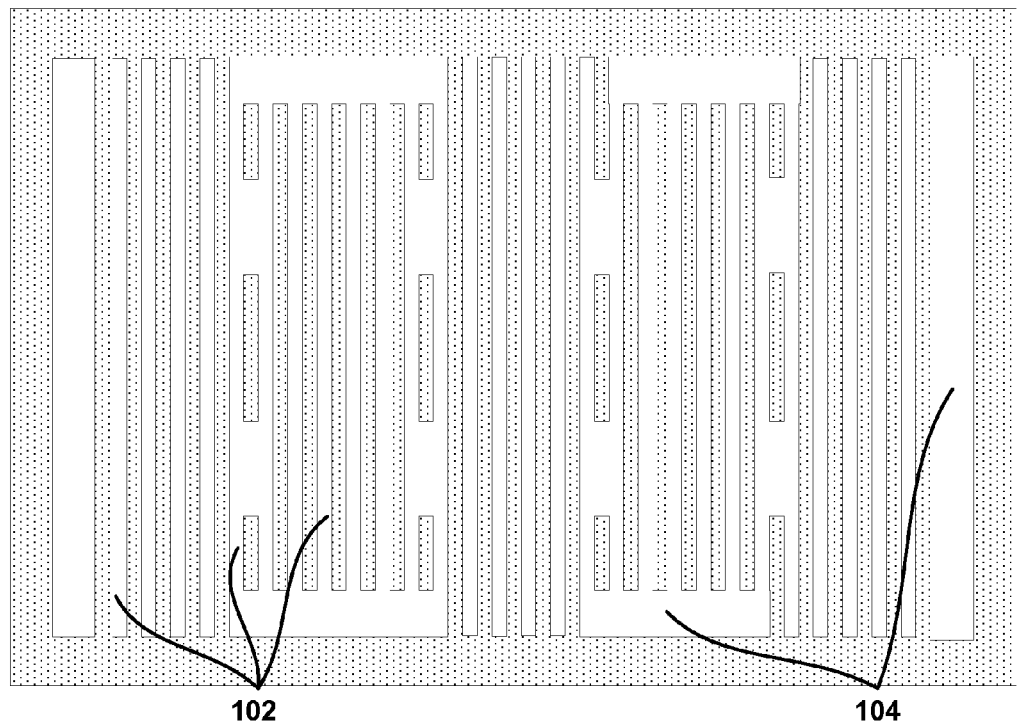
FIGS. 10a and 10b shows a schematic top-down and cross-sectional view according to another embodiment.
Figure 10B:
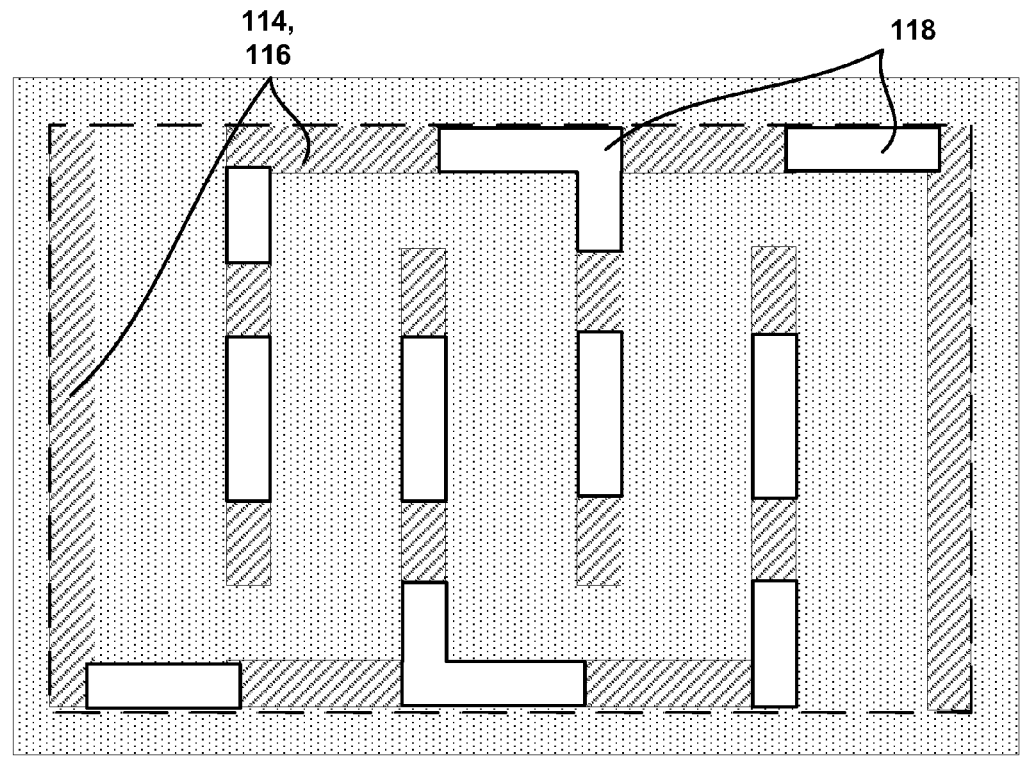

FIGS. 10a and 10b show an alternate embodiment for a layout, where the described method is used to form a serpentine-like silicon plate which is not completely isolated from the substrate, but connected at its ends.

The previously shown embodiments in the figures have been described for the case that the first openings 114 are formed by forming second trenches 104 prior to the described migration process. All detailed embodiments can also be achieved if only the plurality of first trenches 102 are formed prior to the described migration process and the first openings 114 are formed after the migration process by removing semiconductor material as described for the second trenches 104 in a similar layout.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A device comprising:
    a semiconductor substrate of bulk material;
    a semiconductor plate comprising bulk material extending substantially along a plane which is parallel to a main surface of the substrate and located inside the substrate;
    the semiconductor plate having sidewalls essentially surrounding said semiconductor plate,
    a continuous cavity located between the semiconductor substrate and the semiconductor plate in a direction perpendicular to said plane,
    a connection region to connect said semiconductor plate and said semiconductor substrate, wherein said connection region surrounds said semiconductor plate wherein said connection region comprises first connection regions comprising a first deposited dielectric material and second connection regions comprising a second deposited dielectric material and both first and second connection regions abut at said sidewalls of said semiconductor plate and wherein the first deposited dielectric material and the second deposited dielectric material directly abut to the cavity.

2. A device according to claim 1, wherein at least one of the first and second deposited dielectric material overlaps at least a part of the surface of the semiconductor plate located opposite to the cavity.

3. A device according to claim 1, wherein the continuous cavity extends below the connection region.

4. A device according to claim 1, wherein the first and second connection regions completely surround the semiconductor plate to form an electrical insulation between the plate and the substrate.

5. A device according to claim 1, wherein the semiconductor plate has a serpentine-like structure.

6. A device according to claim 5, wherein the serpentine-like structure is connected to the substrate at at least one of its ends.

7. A device according to claim 1, wherein the minimum distance between the substrate and the sidewalls of the semiconductor plate is larger than the minimum width of any of the first and second connection regions in a direction parallel to the main surface of the substrate.

* * * * *